(12) United States Patent
Kim et al.

(10) Patent No.: US 10,672,629 B2
(45) Date of Patent: Jun. 2, 2020

(54) RING ASSEMBLY AND CHUCK ASSEMBLY HAVING THE SAME

(71) Applicant: Samsung Electronics Co., Ltd., Suwon-si, Gyeonggi-do (KR)

(72) Inventors: SungHyup Kim, Hwaseong-si (KR); Dong-Wook Kim, Seoul (KR); Sungmoon Park, Suwon-si (KR); JungHwan Um, Seongnam-si (KR); Taeseok Oh, Anyang-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 295 days.

(21) Appl. No.: 15/470,044

(22) Filed: Mar. 27, 2017

(65) Prior Publication Data

US 2018/0090344 A1 Mar. 29, 2018

(30) Foreign Application Priority Data

Sep. 28, 2016 (KR) ........................ 10-2016-0124737

(51) Int. Cl.

| H01L 21/67 | (2006.01) |
|---|---|
| H01L 21/687 | (2006.01) |
| H01J 37/32 | (2006.01) |
| H01L 21/3065 | (2006.01) |
| H01L 21/673 | (2006.01) |
| H01L 21/68 | (2006.01) |

(52) U.S. Cl.
CPC .. H01L 21/67063 (2013.01); H01J 37/32642 (2013.01); H01L 21/3065 (2013.01); H01L 21/67 (2013.01); H01L 21/6732 (2013.01); H01L 21/68 (2013.01); H01L 21/68735 (2013.01)

(58) Field of Classification Search
CPC ........... H01L 21/67063; H01L 21/3065; H01L 37/32642; H01L 21/67; H01L 21/6732; H01L 21/68; H01L 21/68735
See application file for complete search history.

(56) References Cited

U.S. PATENT DOCUMENTS

| 7,001,482 | B2 | 2/2006 | Landis et al. |
| 7,422,637 | B2 | 9/2008 | Ku et al. |
| 7,658,816 | B2 | 2/2010 | Koshiishi et al. |
| 7,987,814 | B2 | 8/2011 | Carducci et al. |
| 8,057,633 | B2 | 11/2011 | Tsukamoto et al. |
| 8,486,798 | B1 | 7/2013 | Chen et al. |
| 8,826,855 | B2 | 9/2014 | Kellogg et al. |
| 9,123,661 | B2 | 9/2015 | Kellogg |
| 9,376,752 | B2 | 6/2016 | Goel et al. |
| 2001/0054381 | A1* | 12/2001 | Umotoy ............ C23C 16/4401 118/715 |

(Continued)

*Primary Examiner* — Matthew J Song
(74) *Attorney, Agent, or Firm* — Harness, Dickey & Pierce, P.L.C.

(57) ABSTRACT

A ring assembly and a chuck assembly therewith are provided. The ring assembly may include an edge ring that is provided to enclose a chuck body supporting a substrate. The edge ring may include a first top surface, a second top surface positioned outside the first top surface and above the first top surface, a first inner side surface connecting the first top surface to the second top surface, and at least one first flow hole extending outward from one of the first top surface and the first inner side surface, thereby penetrating the edge ring.

23 Claims, 8 Drawing Sheets

(56) References Cited

U.S. PATENT DOCUMENTS

| | | | | |
|---|---|---|---|---|
| 2004/0069227 A1* | 4/2004 | Ku | .................... | C23C 16/4409 |
| | | | | 118/721 |
| 2007/0000109 A1* | 1/2007 | Seo | ................... | C23C 16/44 |
| | | | | 29/25.01 |
| 2007/0193688 A1* | 8/2007 | Dhindsa | ............ | C23C 16/45521 |
| | | | | 156/345.43 |
| 2008/0236497 A1* | 10/2008 | Vukovic | ........... | C23C 16/45521 |
| | | | | 118/728 |
| 2011/0049100 A1* | 3/2011 | Han | ................ | H01J 37/32623 |
| | | | | 216/67 |

* cited by examiner

RING ASSEMBLY AND CHUCK ASSEMBLY HAVING THE SAME

CROSS-REFERENCE TO RELATED APPLICATIONS

This U.S. non-provisional patent application claims priority under 35 U.S.C. § 119 to Korean Patent Application No. 10-2016-0124737, filed on Sep. 28, 2016, in the Korean Intellectual Property Office, the entire contents of which are hereby incorporated by reference.

BACKGROUND

Example embodiments relate to a ring assembly and/or a chuck assembly having the same.

Due to their small-sized, multifunctional, and/or low-cost characteristics, semiconductor devices are being esteemed as important elements in the electronic industry. In general, semiconductor devices may be fabricated by various semiconductor fabrication processes such as deposition, ion-implantation, photolithography, and etching processes. Some of the semiconductor fabrication processes are performed using plasma produced from a process gas. To increase uniformity in density of the plasma used in the semiconductor fabrication processes, an edge ring provided around a chuck body may be used in a substrate processing system.

SUMMARY

Some example embodiments of the inventive concepts provide a ring assembly, which is configured to prevent an air flow from being changed between an edge region of a substrate and an edge ring, and a chuck assembly including the same.

Some example embodiments of the inventive concepts provide a ring assembly, which is configured to improve a process distribution of a substrate, and a chuck assembly including the same.

Some example embodiments of the inventive concepts relate to a ring assembly including an edge ring configured to enclose a chuck body, the chuck body configured to support a substrate, the edge ring including, a first top surface, a second top surface outside the first top surface and above the first top surface with respect to a base of the chuck body, a first inner side surface connecting the first top surface to the second top surface, wherein one of the first top surface and the first inner side surface includes at least one first flow hole extending outward therefrom from such that the edge ring has the first flow hole penetrating therethrough.

Some example embodiments of the inventive concepts relate to a ring assembly configured to enclose a chuck body, the chuck body configured to support a substrate, the ring assembly including a first edge ring; a second edge ring over and spaced apart from the first edge ring; and a plurality of supporting members between the first edge ring and the second edge ring, the plurality of supporting members configured to connect the first edge ring and the second edge ring.

Some example embodiments of the inventive concepts relate to a chuck assembly including a chuck body configured to support a substrate; and an edge ring configured to enclose the chuck body, the edge ring including, a first top surface below a top surface of the chuck body, a second top surface outside and above the first top surface with respect to a base of the chuck body, and a first inner side surface connecting the first top surface to the second top surface, wherein one of the first top surface and the first inner side surface includes at least one first flow hole extending outward therefrom such that the at least one first flow hole penetrates the edge ring.

Some example embodiments of the inventive concepts relate to a chuck assembly configured to support a substrate, the chuck assembly comprising: a baseplate having an electrostatic substrate chuck on an upper surface thereof; and an edge ring configured to surround the electrostatic substrate chuck, the edge ring including an upper surface below a bottom surface of the substrate with a gap therebetween, the edge ring having at least one first flow hole therein such that the edge ring is configured to exhaust a process gas from the gap via the at least one first flow hole.

According to some example embodiments of the inventive concepts, a substrate processing system may include a process chamber, a gas supplying unit configured to supply a process gas onto the process chamber, a gas exhausting unit configured to exhaust gas from the process chamber, an upper electrode unit positioned in the process chamber to generate plasma from the process gas, and a chuck assembly positioned in the process chamber and below the upper electrode unit. The chuck assembly may include a chuck body supporting a substrate and an edge ring enclosing the chuck body. The edge ring may include a first top surface positioned below a top surface of the chuck body, a second top surface positioned outside and above the first top surface, a first inner side surface connecting the first top surface with the second top surface, and at least one first flow hole extending outward from one of the first top surface and the first inner side surface and penetrating the edge ring.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which some example embodiments are shown.

Figure 1:
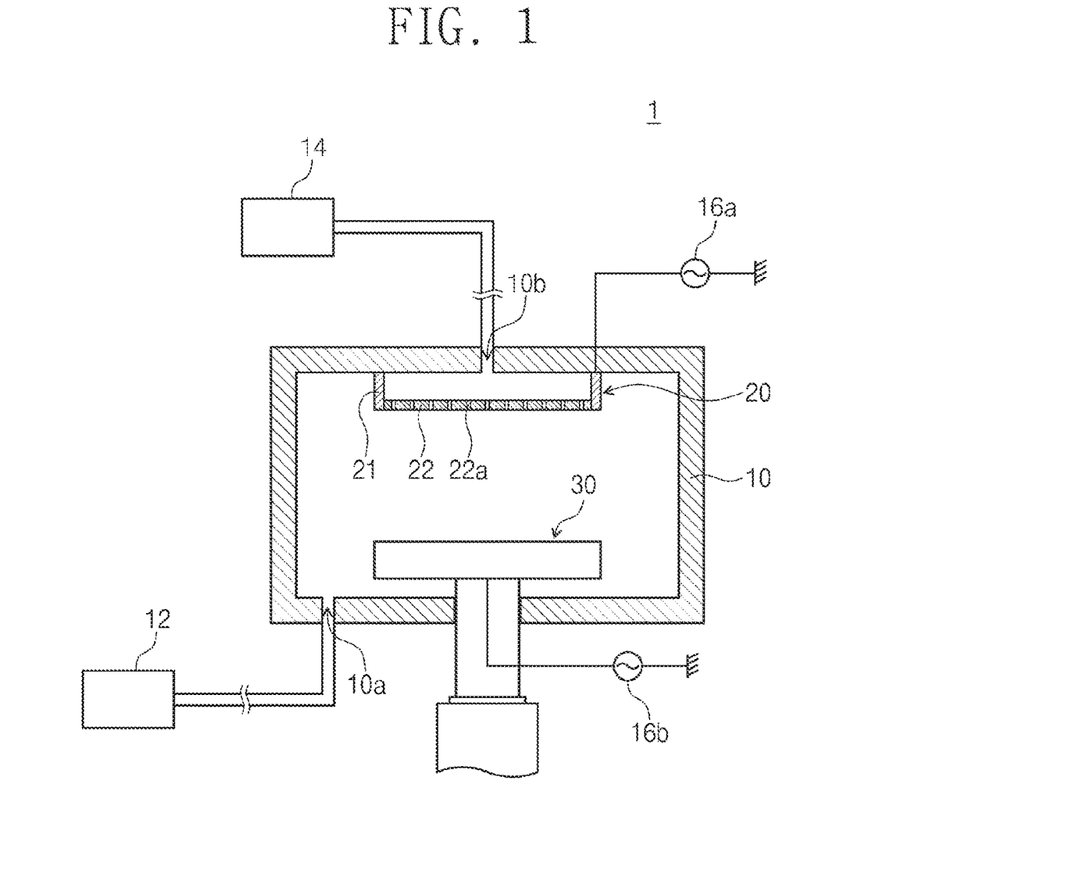
FIG. 1 is a schematic diagram illustrating a substrate processing apparatus according to some example embodiments of the inventive concepts.

FIG. 1 is a schematic diagram illustrating a substrate processing apparatus according to some example embodiments of the inventive concepts.

Referring to FIG. 1, a substrate processing apparatus 1 may be configured to perform a plasma-based substrate processing process (hereinafter, a plasma process), such as etching, cleaning, and deposition processes. The substrate processing apparatus 1 may include a process chamber 10, a gas exhausting unit 12, a gas supplying unit 14, an upper electrode unit 20, and a chuck assembly 30.

The process chamber 10 may provide an internal space for the plasma process. The internal space of the process chamber 10 may be hermetically sealed, during the plasma process. The process chamber 10 may be electrically grounded. The process chamber 10 may include at least one exhausting hole 10a therein. The exhausting hole 10a may be positioned at a lower or bottom portion of the process chamber 10 and may be connected to the gas exhausting unit 12. In some example embodiments, the exhausting hole 10a may be positioned below the chuck assembly 30.

The process chamber 10 may have at least one supplying hole 10b provided at a top portion thereof. In some example embodiments, the supplying hole 10b may be provided at a center of the top portion of the process chamber 10 and may be connected to the gas supplying unit 14.

The gas exhausting unit 12 may exhaust by-products and/or a process gas from the process chamber 10 through the exhausting hole 10a. In some example embodiments, the gas exhausting unit 12 may be a vacuum pump for decreasing an internal pressure of the process chamber 10 (e.g., to the vacuum pressure), but example embodiments of the inventive concepts may not be limited thereto. The gas supplying unit 14 may supply a process gas into the process chamber 10 through the supplying hole 10b.

The upper electrode unit 20 may be provided in the process chamber 10. The upper electrode unit 20 may be formed of a conductive material and may be connected to a first external power 16a to receive an electric power from the first external power 16a. For example, the upper electrode unit 20 may serve as an upper electrode. The upper electrode unit 20 may also inject the process gas, which is supplied into the process chamber 10, toward the chuck assembly 30. In some example embodiments, the upper electrode unit 20 may be a shower head. In such a case, the upper electrode unit 20 may include a sidewall portion 21 and an injection plate 22.

The sidewall portion 21 may extend from the top portion of the process chamber 10 toward a bottom portion. The sidewall portion 21 may be provided in the form of a circular cylinder, but example embodiments of the inventive concepts may not be limited thereto. The injection plate 22 may include a plurality of injection holes 22a for injecting or spraying the process gas toward the chuck assembly 30. The injection plate 22 may be connected to a bottom portion of the sidewall portion 21. For example, the injection plate 22 may be provided to be spaced apart from the top portion of the process chamber 10. That is, an upper space may be provided between the injection plate 22 and the top portion of the process chamber 10. When the process gas is injected toward the chuck assembly 30, the process gas may pass through the upper space and the injection holes 22a.

The chuck assembly 30 may be provided in the process chamber 10. The chuck assembly 30 may be disposed below the upper electrode unit 20. For example, the chuck assembly 30 may be disposed near, but spaced apart from, a lower portion of the upper electrode unit 20. The chuck assembly 30 may support the substrate. In some example embodiments, the chuck assembly 30 may be an electrostatic chuck assembly, but example embodiments of the inventive concepts may not be limited thereto.

The chuck assembly 30 may include a lower electrode (not shown), which is connected to a second external power 16b, and to which an electric power from the second external power 16b is applied. In some example embodiments, the first and second external powers 16a and 16b may apply electric powers to the upper electrode unit 20 and the chuck assembly 30, respectively. For example, the first external power 16a may generate high-frequency power that is applied to the upper electrode unit 20, and the high-frequency power may be used to generate plasma from a process gas. Also, the second external power 16b may generate low-frequency power that is applied to the chuck assembly 30, and the low-frequency power may be used to accelerate plasma particles (e.g., ions, radicals, and so forth) toward the substrate.

Figure 2:
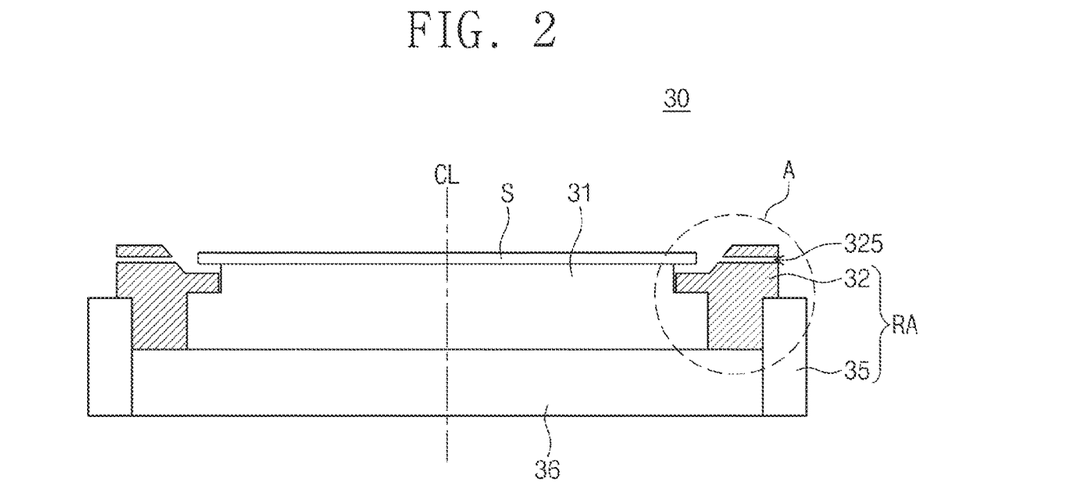
FIG. 2 is a sectional view schematically illustrating a chuck assembly of FIG. 1.

FIG. 2 is a sectional view schematically illustrating the chuck assembly of FIG. 1.

Referring to FIG. 2, according to some example embodiments of the inventive concepts, the chuck assembly 30 may include a chuck body 31, a ring assembly RA, and a base 36.

The chuck body 31 may be positioned on the base 36. The chuck body 31 may allow a substrate S to be loaded on a top surface thereof. In other words, the chuck body 31 may support the substrate S. In some example embodiments, the chuck body 31 may be an electrostatic chuck (ESC). The chuck body 31 may have a conduit, through which cooling water flows, and thus, it may be possible to control temperature of the chuck body 31. A top surface of the chuck body 31 may have a shape corresponding to that of the substrate S. For example, in the case where the substrate S is shaped like a circular plate, the top surface of the chuck body 31 may be circular. In addition, the chuck body 31 may have a stepwise top surface. The chuck body 31 will be described in more detail below.

The ring assembly RA may include an edge ring 32 and a cover ring 35. The ring assembly RA may be provided outside the chuck body 31 and the base 36. The ring assembly RA may be configured to enclose the chuck body 31 and the base 36.

The edge ring 32 may be provided on the base 36. The edge ring 32 may be provided to enclose the chuck body 31. For example, when the substrate S is loaded on a top surface of the chuck body 31, the edge ring 32 may enclose the substrate S on the chuck body 31. The edge ring 32 may be formed of or include at least one of aluminum oxide ($Al_2O_3$), silicon (Si), silicon carbide (SiC), quartz, and yttrium oxide ($Y_2O_3$). For example, the edge ring 32 may be formed of the same material (e.g., silicon (Si)) as that of the substrate S. The edge ring 32 may have at least one first flow hole 32s passing therethrough. The edge ring 32 will be described in more detail below.

The cover ring 35 may enclose the chuck body 31, the edge ring 32, and the base 36. Thus, the cover ring 35 may protect the chuck body 31, the edge ring 32, and the base 36 from plasma. The cover ring 35 may be formed of an insulating material. For example, the cover ring 35 may be formed of quartz, but the inventive concept may not be limited thereto. In the present specification, a term 'outward direction' may refer to a direction away from a center line CL perpendicularly passing through a center of the chuck body 31, and a term 'inward direction' refers to a direction toward the center line CL.

The base 36 may be provided below the chuck body 31 and the edge ring 32 and may support the chuck body 31 and the edge ring 32.

Figure 3:
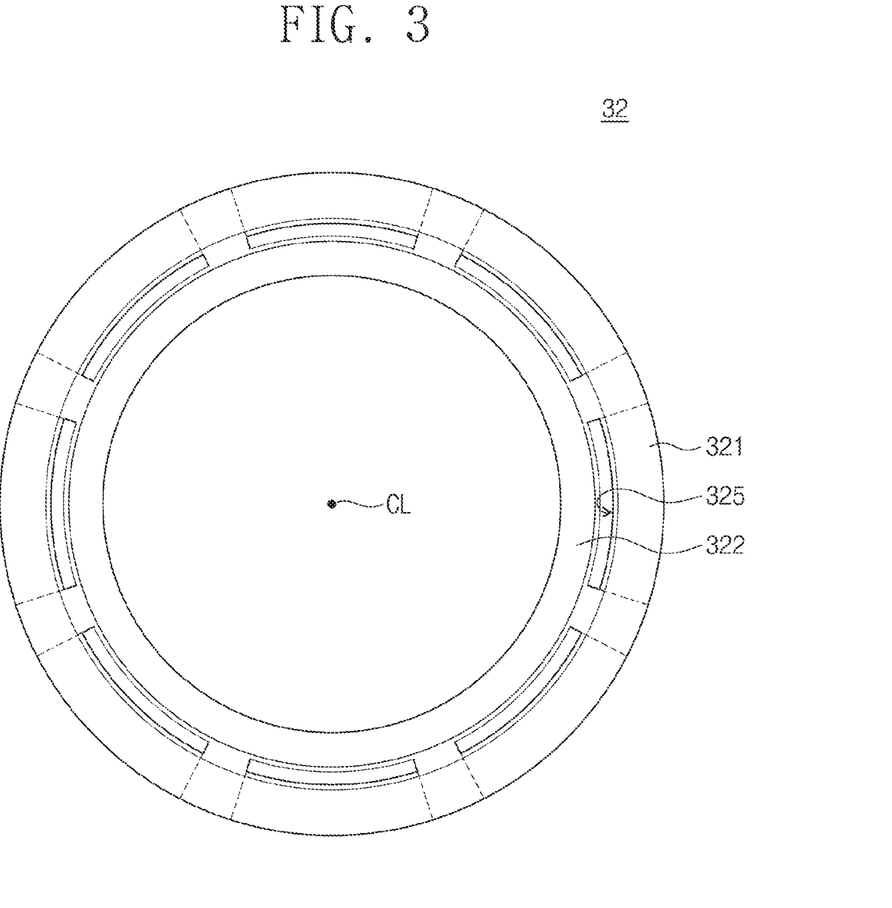
FIG. 3 is a plan view illustrating an edge ring of FIG. 2.
Figure 4:
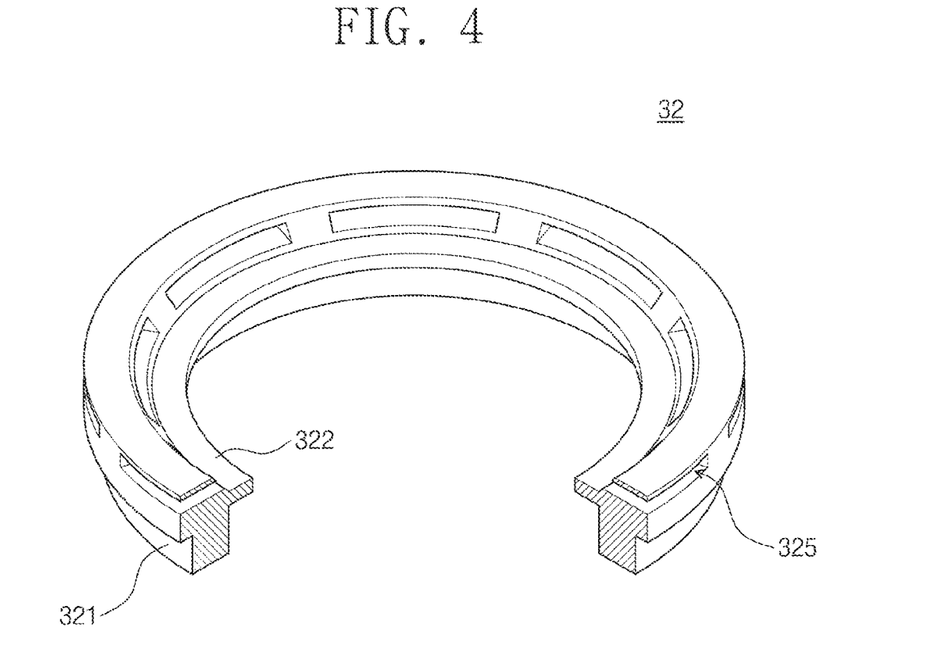
FIG. 4 is a perspective view illustrating a portion of an edge ring of FIG. 2.

FIG. 3 is a plan view illustrating the edge ring 32 of FIG. 2. FIG. 4 is a perspective view illustrating a portion of the edge ring 32 of FIG. 2.

Referring to FIGS. 3 and 4, the edge ring 32 may be provided in the form of a circular ring having an inner diameter and an outer diameter, but example embodiments of the inventive concepts may not be limited thereto. The edge ring 32 may include a ring body portion 321 and a flange portion 322. The flange portion 322 may extend inward from the ring body portion 321. In other words, the flange portion 322 may extend from the ring body portion 321 toward the chuck body 31.

The edge ring 32 may have a plurality of flow holes 325 penetrating the edge ring 32. The flow holes 325 may be provided to connect inner and outer spaces of the edge ring 32 to each other. The flow holes 325 may extend from a top surface and/or an inner side surface of the edge ring 32 to an outer side surface of the edge ring 32, thereby penetrating the edge ring 32. For example, the flow holes 325 may penetrate the ring body portion 321. The flow holes 325 may be positioned above the flange portion 322. The flow holes 325 may be provided along a circumference direction of the edge ring 32 and may be spaced apart from each other by a specific spacing. Each of the flow holes 325 may have an arch shape, when viewed on a plane normal to the center line CL. In some example embodiments, each of the flow holes 325 may have a linear pipe shape, when viewed on a plane normal to the center line CL.

Figure 5:
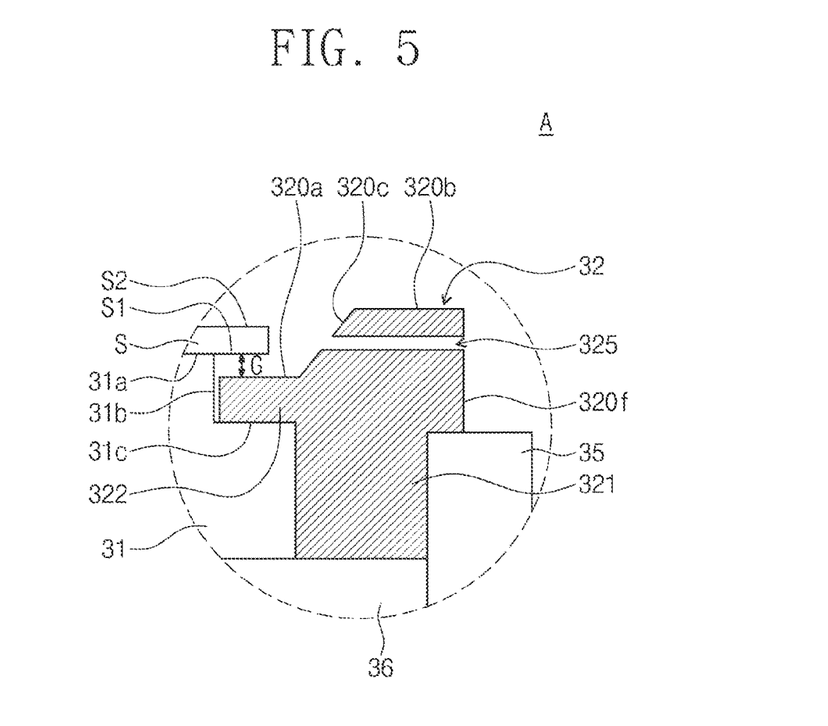
FIG. 5 is an enlarged sectional view of a portion A of FIG. 2.

FIG. 5 is an enlarged sectional view of a portion A of FIG. 2.

Referring to FIGS. 2 to 5, the substrate S may be disposed on a top surface 31a (hereinafter, a supporting surface) of the chuck body 31. Accordingly, the top surface 31a of the chuck body 31 may support the substrate S. The supporting surface 31a may be in contact with a bottom surface S1 of the substrate S. The supporting surface 31a may be flat, but example embodiments of the inventive concepts may not be limited thereto. As described above, the supporting surface 31a may be circular. The supporting surface 31a may have a diameter less than that of the substrate S. Accordingly, a portion of an edge region of the substrate S may be positioned outside the supporting surface 31a. In other words, the portion of the edge region of the substrate S may not be overlapped with the supporting surface 31a.

The chuck body 31 may have a first outer side surface 31b extending downward from a boundary of the supporting surface 31a. The first outer side surface 31b may extend extending from the boundary of the supporting surface 31a toward the base 36. The first outer side surface 31b may be perpendicular to the supporting surface 31a, but example embodiments of the inventive concepts may not be limited thereto. In some example embodiments, the first outer side surface 31b may be spaced apart from the flange portion 322.

The chuck body 31 may have a stepped surface 31c extending outward from a bottom of the first outer side surface 31b. In other words, the stepped surface 31c may extend from the bottom of the first outer side surface 31b toward the edge ring 32. The stepped surface 31c may be formed at a level different from the supporting surface 31a.

The stepped surface 31c may be a flat surface. The stepped surface 31c may be perpendicular to the first outer side surface 31b and may be parallel to the supporting surface 31a. The stepped surface 31c may be in contact with a bottom surface of the flange portion 322 of the edge ring 32. The stepped surface 31c may support the flange portion 322.

A vertical distance between the supporting surface 31a and the stepped surface 31c may be larger than a thickness of the flange portion 322. Accordingly, a gap G may be formed between the top surface of the flange portion 322 and the bottom surface S1 of the substrate S. In the present specification, a term 'thickness' may refer to a length in a vertical direction.

The edge ring 32 may include a first top surface 320a, which is positioned below the top surface 31a of the chuck body 31, a second top surface 320b, which is positioned outside the first top surface 320a, and a first inner side surface 320c connecting the first and second top surfaces 320a and 320b to each other. In some example embodiments, the first and second top surfaces 320a and 320b may refer to the top surfaces of the flange portion 322 and the ring body portion 321, respectively, but example embodiments of the inventive concepts may not be limited thereto.

The first top surface 320a may be positioned below the bottom surface S1 of the substrate S. Accordingly, the gap G may be formed between the bottom surface S1 of the substrate S and the first top surface 320a. In some example embodiments, a thickness of the gap G may range from about 1 mm to about 10 mm, but example embodiments of the inventive concepts may not be limited thereto.

The first top surface 320a may be a flat surface. The first top surface 320a may be parallel to the supporting surface 31a and/or the bottom surface S1 of the substrate S. At least a portion of the first top surface 320a may be overlapped with an edge region of the substrate S, when viewed in a plan view.

The second top surface 320b may be positioned above the first top surface 320a. Accordingly, the first top surface 320a and the second top surface 320b may be formed at different levels. The second top surface 320b may be positioned above the supporting surface 31a. As shown in FIG. 5, the second top surface 320b may be positioned above a top surface S2 of the substrate S on the supporting surface 31a. This may make it possible to reduce a change in electric field of the chuck assembly 30 (e.g., of FIG. 2). In some example embodiments, the second top surface 320b may be a flat surface. The second top surface 320b may be parallel to the first top surface 320a and/or the supporting surface 31a.

The first inner side surface 320c may be provided to connect the first top surface 320a to the second top surface 320b. In some example embodiments, the first inner side surface 320c may extend outward and upward from the first top surface 320a in an inclined manner. In other words, the first inner side surface 320c may be an inclined surface. The first inner side surface 320c may be a part of an inner side surface of the ring body portion 321.

The flow holes 325 may be provided to penetrate the edge ring 32. For example, the flow hole 325 may extend outward from the first top surface 320a and/or the first inner side surface 320c. In some example embodiments, the flow hole 325 may be formed to penetrate the first inner side surface 320c and an outer side surface 320f of the edge ring 32. The flow hole 325 may have an inlet, which is formed through the first inner side surface 320c, and an outlet, which is formed through the outer side surface 320f of the edge ring 32.

The flow hole 325 may be positioned between the first top surface 320a and the second top surface 320b. The flow hole 325 may be parallel to the first top surface 320a and/or the second top surface 320b. In some example embodiments, the flow hole 325 may be positioned above the top surface 31a of the chuck body 31. In other example embodiments, the flow hole 325 may be positioned below the top surface 31a of the chuck body 31. The flow hole 325 may allow a process gas between the bottom surface S1 of the substrate S and the first top surface 320a to flow toward an outer space of the edge ring 32.

The ring body portion 321 may be positioned on the base 36 and the cover ring 35, and the flange portion 322 may be positioned on the stepped surface 31c of the chuck body 31. In other words, the edge ring 32 may be supported by the chuck body 31, the cover ring 35, and the base 36.

Figure 6A:
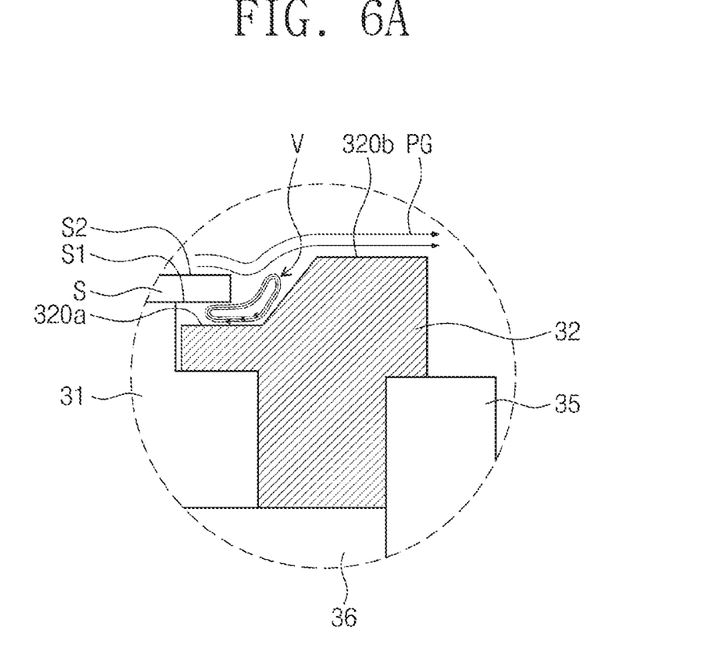
FIG. 6A is a diagram schematically illustrating a flow of a process gas, when no flow hole is provided in an edge ring of FIG. 5.
Figure 6B:
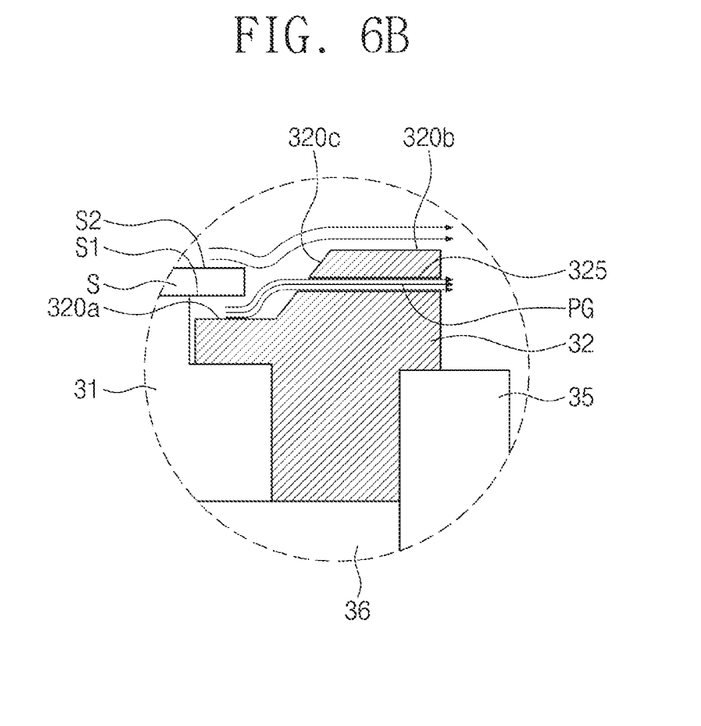
FIG. 6B is a diagram schematically illustrating a flow of a process gas, when a flow hole is provided in an edge ring of FIG. 5.

FIG. 6A is a diagram schematically illustrating a flow of a process gas, when no flow hole is provided in an edge ring of FIG. 5. FIG. 6B is a diagram schematically illustrating a flow of a process gas, when a flow hole is provided in an edge ring of FIG. 5.

Referring to FIG. 6A, the edge ring 32 may be spaced apart from the edge region of the substrate S. In other words, a space (hereinafter, an accumulation region) may be formed between the edge ring 32 and the substrate S. A process gas PG may flow in the accumulation region.

The first top surface 320a of the edge ring 32 may be positioned below the bottom surface S1 of the substrate S, and the second top surface 320b of the edge ring 32 may be positioned above the top surface S2 of the substrate S. In other words, the top surface of the edge ring 32 may be formed to have a stepwise shape. The process gas PG may be accumulated in the accumulation region, owing to various causes (e.g., the stepwise structure of the top surface of the edge ring 32, another portion of the process gas flowing on the substrate S and the edge ring 32, and a vortex V formed in the accumulation region).

The process gas PG (hereinafter, residual gas) that is accumulated in the accumulation region may contain by-products (e.g., radicals, polymers, and so forth) which may be produced in a substrate processing process. The process by-products may be piled up on the first top surface 320a of the edge ring 32, and owing to the vortex V, some of the process by-products may fall to the substrate S. This may lead to a process failure (e.g., a poor process distribution of the substrate).

Referring to FIG. 6B, in one or more example embodiments, the process gas PG in the accumulation region may be exhausted to the outside of the edge ring 32 through the flow holes 325 of the edge ring 32. Accordingly, it may be possible to reduce a probability of (or, alternatively, prevent) the process by-products from being piled up on the first top surface 320a of the edge ring 32 and to reduce a probability of (or, alternatively, prevent) some of the process by-products from falling to the substrate S by the vortex V. As a result, it may be possible to suppress or reduce the process failure (e.g., a poor process distribution of the substrate) which may be caused by the process by-products.

Figure 7:
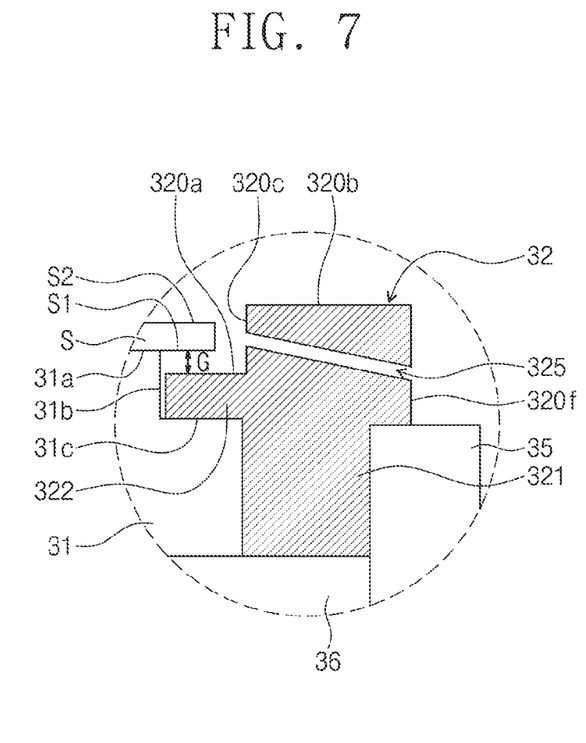
FIGS. 7 to 9 are sectional views schematically illustrating other examples of the edge ring of FIG. 5.
Figure 8:
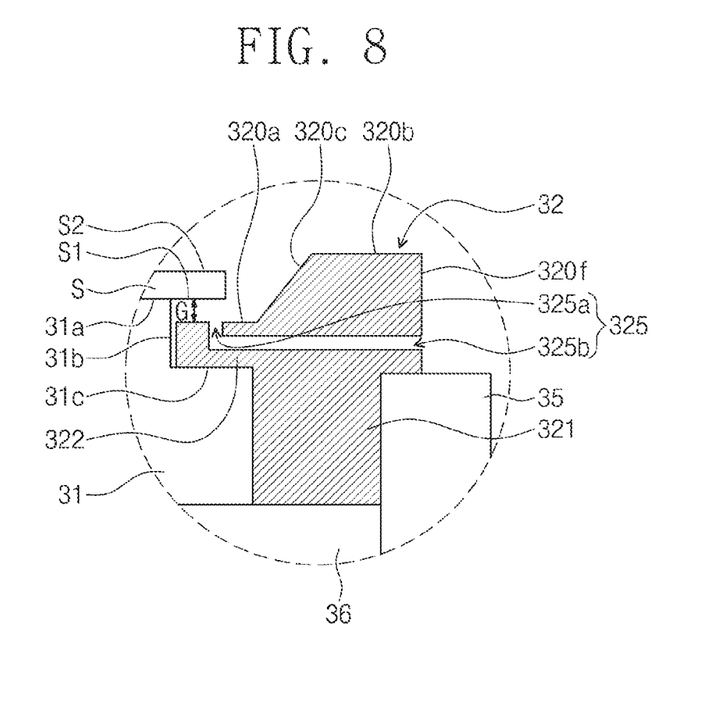
Figure 9:
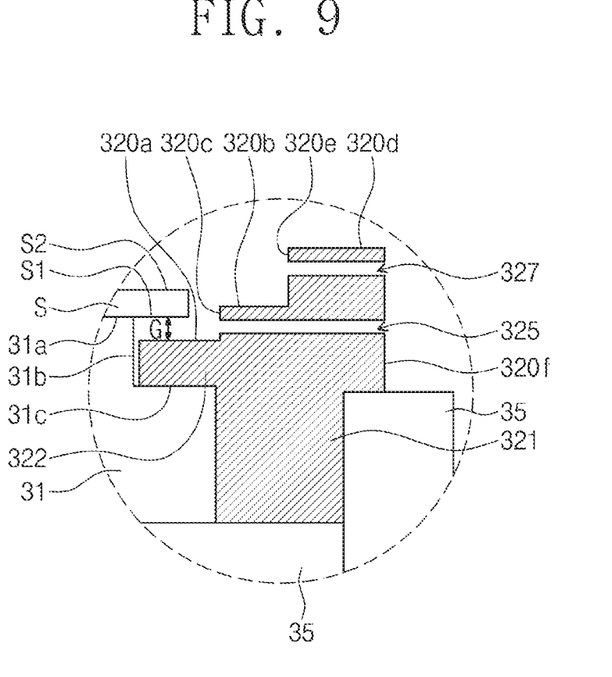

FIGS. 7 to 9 are sectional views schematically illustrating other examples of the edge ring of FIG. 5. For concise description, an element previously described with reference to FIG. 5 may be identified by a similar or identical reference number without repeating an overlapping description thereof.

Referring to FIG. 7, the first top surface 320a may be parallel to the second top surface 320b. The first inner side surface 320c may extend from the first top surface 320a in an upward vertical direction. In other words, the first inner side surface 320c may be perpendicular to the first top surface 320a and the second top surface 320b. The flow hole 325 may extend from the first inner side surface 320c toward the outside in an inclined downward direction. An inlet of the flow hole 325 may be positioned above an outlet of the flow hole 325. In this case, by virtue of gravity, the process gas in the accumulation region may be more effectively exhausted to the outside of the edge ring 32 through the flow hole 325.

Referring to FIG. 8, the flow hole 325 may be formed to connect the first top surface 320a to the outer side surface 320f. In some example embodiments, the flow hole 325 may include a first hole region 325a extending downward from the first top surface 320a and a second hole region 325b extending outward from the first hole region 325a. The second hole region 325b may be connected to the first hole region 325a. In some example embodiments, the flow hole 325 may have a vertical section that is shaped like a letter 'L'. In certain embodiments, the flow hole 325 may extend outward and downward from the first top surface 320a in an inclined manner, thereby penetrating the first top surface 320a and the outer side surface 320f of the edge ring 32. Accordingly, the process gas in the accumulation region may be exhausted to the outside of the edge ring 32 through the first and second hole regions 325a and 325b.

Referring to FIG. 9, the edge ring 32 may include the first top surface 320a, the second top surface 320b, and the first inner side surface 320c. In addition, the edge ring 32 may include a third top surface 320d, which is positioned above the second top surface 320b, and a second inner side surface 320e connecting the second top surface 320b to the third top surface 320d. The edge ring 32 of FIG. 8 may be thicker than the edge ring 32 of FIG. 5. Accordingly, the edge ring 32 of FIG. 8 may have a lifetime longer than that of FIG. 5.

The third top surface 320d may be positioned outside the second top surface 320b. The second top surface 320b and the third top surface 320d may be formed at different levels. The third top surface 320d may be positioned above the top surface 31a of the chuck body 31 and the top surface S2 of the substrate S.

The edge ring 32 may have flow holes 327 that are formed to connect the second inner side surface 320e to the outer side surface 320f. In the following description, for the sake of brevity, the flow hole 325 connecting the first inner side surface 320c to the outer side surface 320f may be referred to as a first flow hole, and the flow hole 327 connecting the second inner side surface 320e to the outer side surface 320f may be referred to as a second flow hole.

The second flow hole 327 may extend outward from the second inner side surface 320e. The second flow hole 327 may be provided to pass through the second inner side surface 320e and the outer side surface 320f. In other words, the second flow hole 327 may penetrate the edge ring 32. Accordingly, the process gas which is accumulated between the second top surface 320b and the third top surface 320d may be exhausted to the outside of the edge ring 32 through the second flow hole 327.

The second flow hole 327 may be positioned above the first flow hole 325. For example, the second flow hole 327 may have an inlet, which is formed through the second inner side surface 320e, and an outlet, which is formed through the outer side surface 320f of the edge ring 32. In some example embodiments, the second flow hole 327 may be parallel to the first flow hole 325. The second flow hole 327 may be positioned between the second top surface 320b and the third top surface 320d. In certain embodiments, the second flow hole 327 may extend from the second inner side surface 320e in an inclined downward direction.

Figure 10:
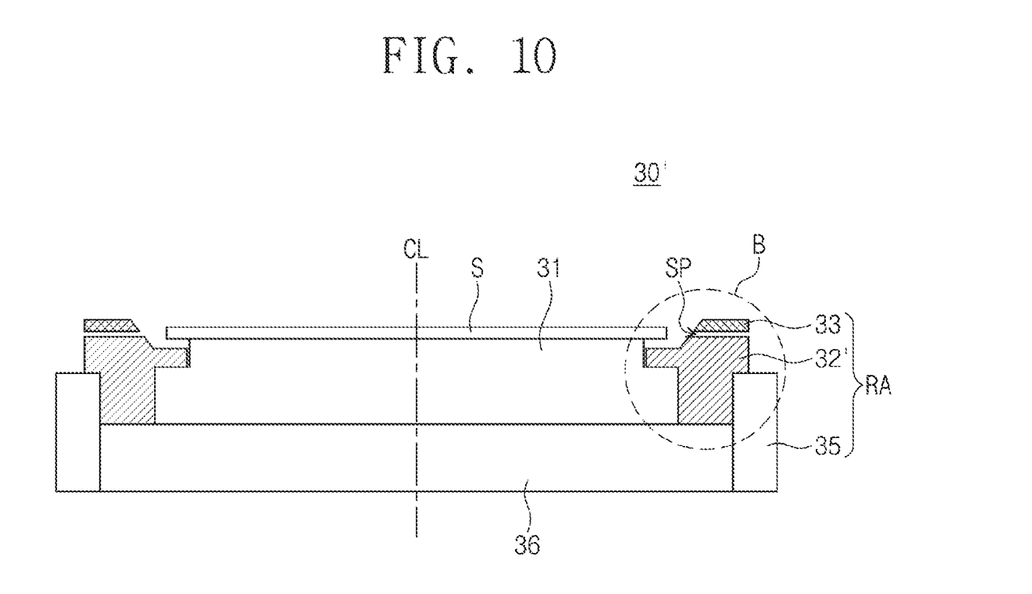
FIG. 10 is a schematic diagram illustrating a chuck assembly according to some example embodiments of the inventive concepts.
Figure 11:
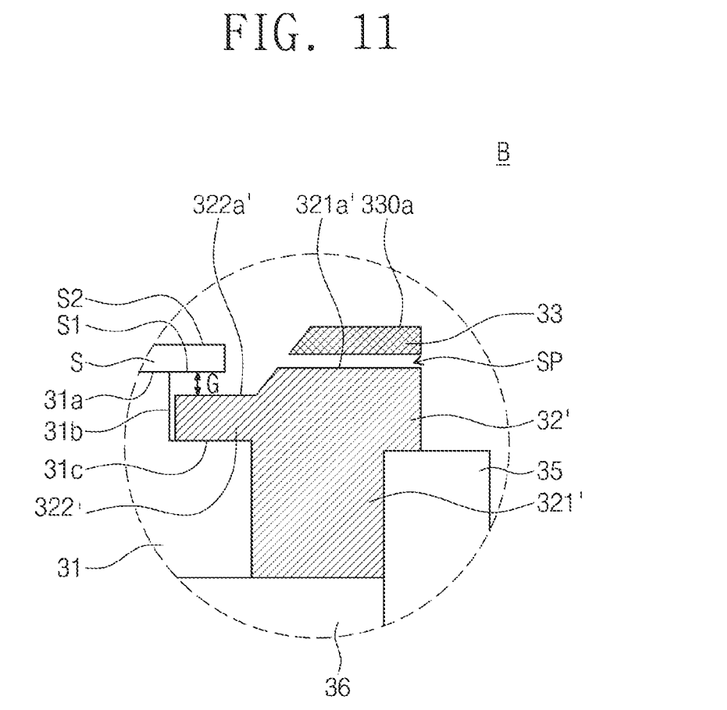
FIG. 11 is an enlarged sectional view of a portion B of FIG. 10.
Figure 12:
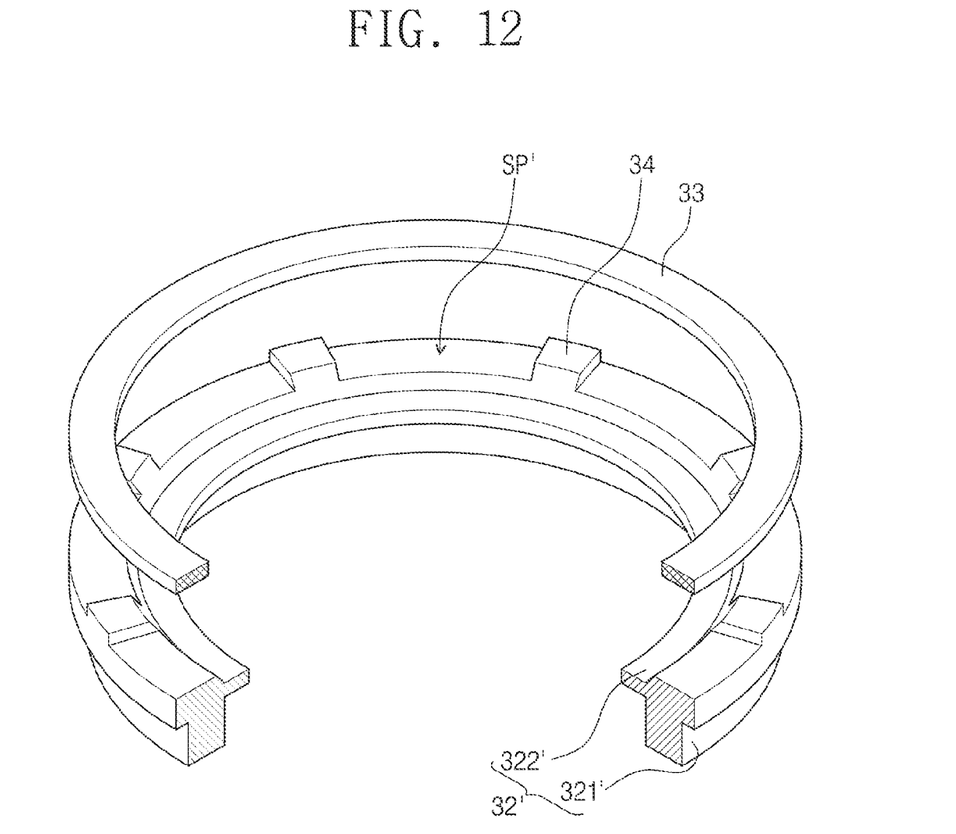
FIG. 12 is an exploded perspective view illustrating a ring assembly of FIG. 10.

FIG. 10 is a schematic diagram illustrating a chuck assembly according to some example embodiments of the inventive concepts. FIG. 11 is an enlarged sectional view of a portion B of FIG. 10. FIG. 12 is an exploded perspective view illustrating a ring assembly of FIG. 10. For concise description, an element previously described with reference to FIGS. 2 to 5 may be identified by a similar or identical reference number without repeating an overlapping description thereof.

Referring to FIGS. 10 to 12, a chuck assembly 30' may include the chuck body 31, the ring assembly RA and the base 36. The ring assembly RA may include a first edge ring 32', a second edge ring 33, a supporting member 34, and the cover ring 35.

The first edge ring 32' may be provided to enclose the chuck body 31 and may be positioned above the base 36. The first edge ring 32' may be provided in the form of a circular ring. The first edge ring 32' may include a first ring body portion 321' and a first flange portion 322' protruding from an intermediate region of the first ring body portion 321' toward the chuck body 31. The first flange portion 322' may be positioned above the stepped surface 31c. In other words, the first flange portion 322' may be supported by the chuck body 31. A top surface 322a' of the first flange portion 322' may be positioned below the top surface 31a of the chuck body 31. In some example embodiments, a top surface 321a' of the first ring body portion 321' may be positioned below the supporting surface 31a. In a probability of embodiments, the top surface 321a' of the first ring body portion 321' may be positioned above the supporting surface 31a.

The second edge ring 33 may enclose the chuck body 31 and may be spaced apart from the first edge ring 32' in an upward direction. For example, the second edge ring 33 may be overlapped with the top surface 321a' of the first ring body portion 321', when viewed in a plan view. Accordingly, a space SP may be formed between the first and second edge rings 32' and 33. The second edge ring 33 may be provided in the form of a circular ring. The second edge ring 33 may have an inner diameter that is larger than that of the first edge ring 32'. A top surface 330a of the second edge ring 33 may be positioned above the top surface 31a of the chuck body 31. Also, the top surface 330a of the second edge ring 33 may be positioned above the top surface S2 of the substrate S.

The supporting member 34 may be positioned between the first edge ring 32' and the second edge ring 33. The supporting member 34 may be connected to the first and second edge rings 32' and 33. For example, a portion of the supporting member it 34 may be connected to the first edge ring 32', and other portion of the supporting member 34 may be connected to the second edge ring 33. In other words, the supporting member 34 on the first edge ring 32' may support the second edge ring 33. In some example embodiments, a plurality of the supporting members 34 may be provided. The plurality of the supporting units 34 may be disposed along a circumference direction of the first edge ring 32' and may be spaced apart from each other by a specific spacing. In some example embodiments, the supporting members 34 may be used to divide the space SP between the first and second edge rings 32' and 33 into a plurality of regions. A divided region of the space SP defined by an adjacent pair of the supporting members 34 may correspond to the flow hole 325 (e.g., of FIG. 5). In some example embodiments, the supporting members 34 may be used to connect the first and second edge rings 32' and 33 to each other, not to divide the space SP between the first and second edge rings 32' and 33. The divided regions of the space SP may be spatially separated from each other.

In some example embodiments, the space SP between the first and second edge rings 32' and 33 may be positioned below the top surface 31a of the chuck body 31, but example embodiments of the inventive concepts may not be limited thereto. In some example embodiments, the supporting members 34 and the first edge ring 32' may be connected to each other, thereby constituting a single body. The supporting members 34 and the first edge ring 32' are integrally formed. For example, the supporting units 34 may be provided on and continuously connected to the first ring body portion 321'. Accordingly, flow recesses SP' may be formed on the first ring body portion 321', as shown in FIG. 12. The flow recesses SP' may have a top-opened shape. The flow recesses SP' may be disposed along a circumference direction of the first edge ring 32' and may be spaced apart from each other by a specific spacing. Each of the flow recesses SP' may have an arch shape, when viewed in a plan view. The flow recesses SP' may be positioned above the top surface 322a' of the first flange portion 322'. The flow recesses s SP' may extend from a center of the first edge ring 32' in a radial direction. The second edge ring 33 may be positioned on the supporting member 34 to close top openings of the flow recesses SP'. The flow recesses SP' with the closed top openings may correspond to the flow holes 325 of FIG. 5.

In some example embodiments, the supporting members 34 and the second edge ring 33 may be connected to each other, thereby constituting a single body. The supporting members 34 and the second edge ring 33 are integrally formed. Accordingly, the flow recesses may be formed under the second edge ring 33. The flow recesses may have a bottom-opened shape. In this case, the bottom openings of the flow recesses may be closed by the first edge ring 32'.

According to some example embodiments of the inventive concepts, a ring assembly RA may prevent an air flow from being disturbed between the substrate S and the edge ring 32 and thereby to reduce variation in a substrate processing process.

While some example embodiments of the inventive concepts have been particularly shown and described, it will be understood by one of ordinary skill in the art that variations in form and detail may be made therein without departing from the spirit and scope of the attached claims.

What is claimed is:

1. A ring assembly comprising:
an edge ring configured to enclose a chuck body, the chuck body configured to support a substrate, the edge ring including,
a first top surface defining a top of a flange extending from a ring body of the edge ring,
a second top surface outside the first top surface and above the first top surface with respect to a base of the chuck body, and
a first inner side surface connecting the first top surface to the second top surface, one of the first top surface and the first inner side surface including at least one first flow hole extending outward therefrom from such that the edge ring has the first flow hole penetrating therethrough at an upper portion of the edge ring above the flange with a portion of the second top surface vertically overlapping with the at least one first flow hole above the flange.

2. The ring assembly of claim 1, wherein the first inner side surface includes the first flow hole extending outward therefrom between the first top surface and the second top surface.

3. The ring assembly of claim 2, wherein the first inner side surface has the first flow hole extending therefrom parallel to the first top surface.

4. The ring assembly of claim 1, wherein the first inner side surface includes the first flow hole extending outward therefrom and downward in an inclined manner.

5. The ring assembly of claim 1, wherein the first flow hole comprises:
a first hole region extending downward from the first top surface; and
a second hole region extending outward from the first hole region.

6. The ring assembly of claim 1, wherein the edge ring includes multiple ones of the first flow hole each spaced apart from each other along a circumference direction of the edge ring.

7. The ring assembly of claim 6, wherein, when viewed in a plan view, the multiple ones of the first flow hole included in the edge ring are each arch shaped.

8. The ring assembly of claim 1, wherein the edge ring further comprises:
a third top surface outside and above the second top surface with respect to the base of the chuck body; and
a second inner side surface connecting the second top surface to the third top surface, the second inner side surface including at least one second flow hole therein above the first flow hole such that the edge ring has the at least one second flow hole penetrating therethrough.

9. The ring assembly of claim 8, wherein the second flow hole is between the second top surface and the third top surface.

10. The ring assembly of claim 1, wherein
each of the first and second top surfaces is a flat surface, and
the first inner side surface is one of inclined upward in a direction from the first top surface to an outside or vertically extending upward from the first top surface.

11. The ring assembly of claim 1, wherein the first inner side surface connects the first top surface to another portion of the second top surface.

12. The ring assembly of claim 1, wherein the edge ring has the at least one first flow hole and at least one second flow hole therein at different heights with respect to the base.

13. A chuck assembly, comprising:
a chuck body configured to support a substrate; and
an edge ring configured to enclose the chuck body, the edge ring including,
a first top surface below a top surface of the chuck body, the first top surface defining a top of a flange extending from a ring body of the edge ring,
a second top surface outside and above the first top surface with respect to a base of the chuck body, and
a first inner side surface connecting the first top surface to the second top surface, one of the first top surface and the first inner side surface including at least one first flow hole extending outward therefrom such that the at least one first flow hole penetrates the edge ring at an upper portion of the edge ring above the flange with a portion of the second top surface vertically overlapping with the at least one first flow hole above the flange.

14. The chuck assembly of claim 13, wherein the first inner side surface includes the first flow hole extending outward therefrom between the first top surface and the second top surface.

15. The chuck assembly of claim 13, wherein the first flow hole comprises:
first hole region extending downward from the first top surface; and
a second hole region extending outward from the first hole region.

16. The chuck assembly of claim 13, wherein the first flow hole is below the top surface of the chuck body.

17. The chuck assembly of claim 13, wherein the edge ring further comprises:
a third top surface outside and above the second top surface with respect to the base of the chuck body; and
a second inner side surface connecting the second top surface to the third top surface, the second inner side surface including at least one second flow hole therein above the first flow hole such that the edge ring has the at least one second flow hole penetrating therethrough.

18. The chuck assembly of claim 13, wherein the edge ring has the at least one first flow hole and at least one second flow hole therein at different heights with respect to the base.

19. A chuck assembly configured to support a substrate, the chuck assembly comprising:
a baseplate having an electrostatic substrate chuck on an upper surface thereof; and
an edge ring including a ring body and a flange extending from the ring body, the edge ring configured to surround the electrostatic substrate chuck, the edge ring including a first top surface and a second top surface, the first top surface defining a top of the flange such that the first top surface is below a bottom surface of the substrate with a gap therebetween, the second top surface located at a vertical level higher than the first top surface, the edge ring having at least one first flow hole therein at an upper portion of the edge ring above the flange such that the edge ring is configured to exhaust a process gas from the gap via the at least one first flow hole, the at least one first flow hole located at a level between the first top surface and the second top surface with a portion of the second top surface vertically overlapping with the at least one first flow hole.

20. The chuck assembly of claim 19, wherein the first top surface has an upwardly stepped shape.

21. The chuck assembly of claim 19, wherein, the flange extends inwards towards a center of the baseplate, and the ring body including the at least one first flow hole therein.

22. The chuck assembly of claim 21, wherein further comprising:
a supporting member configured to vertically separate the at least one first flow hole from at least one second flow hole above the at least one first flow hole in the ring body.

23. The chuck assembly of claim 19, wherein the edge ring has the at least one first flow hole and at least one second flow hole therein at different heights with respect to the baseplate.

* * * * *